United States Patent [19] [11] Patent Number: 4,957,873
Ojha et al. [45] Date of Patent: Sep. 18, 1990

[54] PROCESS FOR FORMING ISOLATION TRENCHES IN SILICON SEMICONDUCTOR BODIES

[75] Inventors: Sureshchandra M. Ojha; Paul J. Rosser, both of Harlow; Philip B. Moynagh, Buckhurst Hill, all of Great Britain

[73] Assignee: STC PLC, London, England

[21] Appl. No.: 411,196

[22] Filed: Sep. 21, 1989

Related U.S. Application Data

[63] Continuation of Ser. No. 253,971, Oct. 5, 1988, abandoned.

[30] Foreign Application Priority Data

Oct. 7, 1987 [GB] United Kingdom ............... 8723539

[51] Int. Cl.⁵ .......................................... H01L 21/266
[52] U.S. Cl. ...................................... 437/20; 437/26; 437/69; 437/940
[58] Field of Search ..................... 437/20, 24, 61, 69, 437/940, 238, 239, 240, 26

[56] References Cited

U.S. PATENT DOCUMENTS 4,717,687  1/1988  Verma .................................. 437/97

FOREIGN PATENT DOCUMENTS 53-83465   7/1978  Japan .................................. 437/940
58-170030 10/1983  Japan .................................. 437/940
59-4137    1/1984  Japan .................................. 437/70
59-100552  6/1984  Japan .................................. 437/61
60-97637   5/1985  Japan .................................. 437/70

OTHER PUBLICATIONS

Wolf et al., Silicon Processing for the VLSI Era V.1, Lattice Process, Sunset Beach, Calif., U.S.A. (1986), pp. 200–207, 212–215.

Primary Examiner—Olik Chaudhuri
Assistant Examiner—O. Ojan
Attorney, Agent, or Firm—Lee, Mann, Smith, McWilliams & Sweeney

[57] ABSTRACT

Isolation trenches are formed in a semiconductor, e.g. silicon, substrate by selectively doping the substrate and preferentially oxidizing the doped material. Typically the dopant is arsenic or phosphorus and preferably the substrate is doped to a level of at least $5 \times 10^{19}$ cm$^{-3}$.

2 Claims, 2 Drawing Sheets

PROCESS FOR FORMING ISOLATION TRENCHES IN SILICON SEMICONDUCTOR BODIES

This application is a continuation of application Ser. No. 253,971, filed Oct. 5, 1988, now abandoned.

BACKGROUND OF THE INVENTION

This invention relates to integrated circuits, and in particular to the provision of insulating regions in said circuits.

The fabrication of an integrated circuit generally involves the provision of insulation between certain components and/or certain parts of the circuit. With the trend towards very large scale integration (VLSI) it is becoming apparent that conventional insulating techniques are not readily compatible with the very small device geometries that are being proposed for such circuits. In an attempt to overcome this problem the technique of trench isolation has been proposed. In this technique, components to be mutually isolated are separated by a trench or groove cut into the semiconductor surface. This groove is filled e.g., with silicon dioxide which provides the electrical isolation.

Conventionally, trenches are cut into the semiconductor surface by dry etching, e.g., plasma etching or reactive ion etching, and are then filled by an oxidation process. This technique has been found to suffer from two major difficulties. Firstly, the required dimensions of the trench are very small, typically less than 1 micron in width. At such small dimensions it has been found that the etching process is limited by diffusion of gas into and out of the trench thus making trench profile control difficult. Secondly it has been found that complete filling of the trench with oxide is a extremely difficult process. Void formation within the oxide filling causes subsequent breakdown of the insulation.

The object of the present invention is to minimize or to overcome these disadvantages.

SUMMARY OF THE INVENTION

According to the invention there is provided a method of fabricating an insulator-filled isolation trench in a major surface of a semiconductor substrate, the method including selectively doping the substrate to define the trench region, and chemically converting the doped semiconductor to a body of insulating material.

Typically the insulating material is silicon oxide formed by preferential oxidation of the doped material.

BRIEF DESCRIPTION OF THE DRAWINGS

An embodiment of the invention will now be described with reference to the accompanying drawings in which.

DESCRIPTION OF PREFERRED EMBODIMENTS

Figure 1:
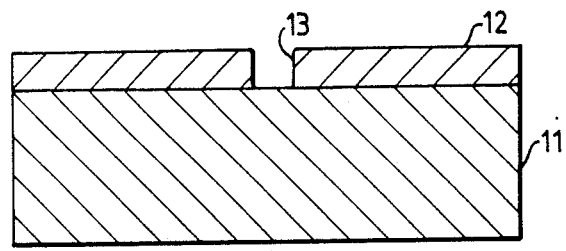
FIG. 1 to 3 illustrate successive stages in the formation of an isolation trench in a semiconductor substrate.
Figure 2:
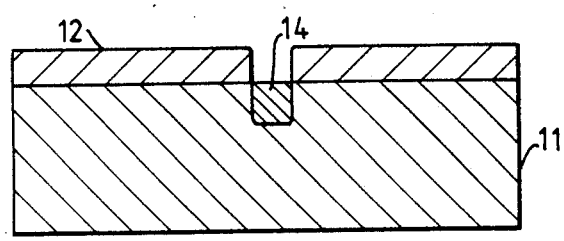

Referring to the drawings, a semiconductor substrate 11 (FIG. 1) is provided with a mask 12 having an opening 13 in register with the desired position with an isolation trench. Using the mask 12, a heavily doped region 14 (FIG. 2) is formed by ion implantation or by diffusion. The dimension of this doped region correspond to those of the trench that is to be formed.

In some applications the mask 12 may be dispensed with and the dopant implanted via a direct write ion beam process. Typically we employ an accelerating voltage of 50 to 150 keV for the implantation of ions.

The dopant is such that preferential oxidation of doped material occurs. Typically the dopant is arsenic or phosphorus. Advantageously the surface concentration of the dopant is at least $5 \times 10^{19}$ cm$^{-3}$ and preferably at least $5 \times 10^{20}$ cm$^{-3}$. It is preferred to employ a high dopant concentration as this provides an enhanced oxidation site.

Figure 3:
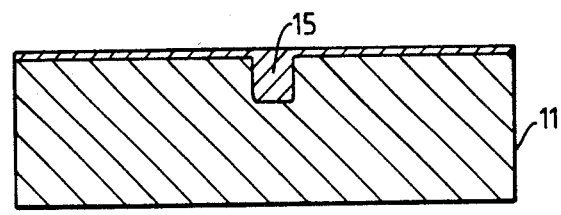

The mask 12 is removed and the doped substrate 11 is heated in an oxygen atmosphere, preferably under pressure. This causes oxidation of the silicon, but the doped material oxidizes at a significantly faster rate than the undoped material to form an oxide filled trench 15 (FIG. 3) in the position defined by the dopant. Typically we perform this oxidation step at a temperature of 850° to 950° C. At higher temperatures the difference in oxidation rates between doped and undoped material is significantly reduced. Thus we prefer not to exceed a temperature of 950° C. for the oxidation step.

We have found that the method provides a high oxidation rate of doped material combined with only a small degree of oxide silicon interface maintains a pile-up of dopant thus providing oxidation to depth well below the original dopant depth. As there is little enhancement of oxidation rate at low dopant concentration, sideways diffusion of the dopant during the oxidation process is not a problem as the region adjacent the trench region is doped only at the low level. Thus, the trench dimensions are accurately defined by the dimensions of the doped region 14. This permits the technique to be employed with very small device geometries.

The oxidation of silicon is modelled by the equation:

$$x^2 + Ax = B(t+T) \qquad (1)$$

where x is the oxide film thickness, t is the elapsed time, and T is a constant whose volume is determined by an initial film thickness. A and B are factors whose values are dependent on the temperature and pressure conditions under which oxidation is performed.

For short time periods equation (1) approximates to the linear equation $$x = \frac{B}{A}(t+T)$$

whilst for extended time periods equation (1) approximates to $$x^2 32 Bt$$

Figure 4:
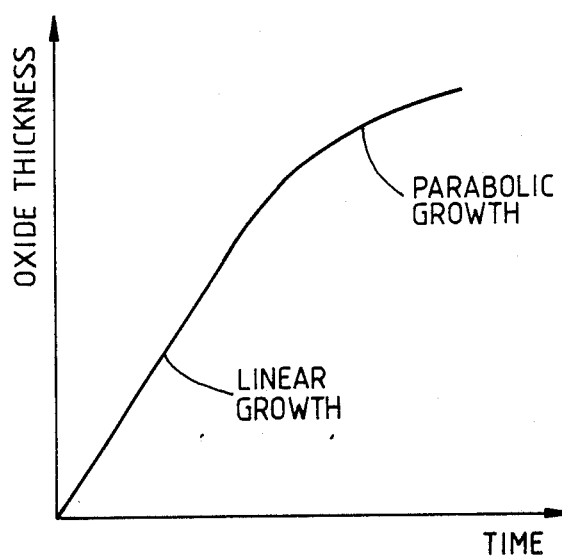
FIG. 4 illustrates a typical surface oxidation characteristic for silicon.

These two growth characteristics are referred to as linear growth and parabolic growth respectively. This effect is indicated substantially in FIG. 4 of the accompanying drawings in which it can be seen that an initial period of substantially linear growth is followed by a non-linear or parabolic characteristics. The two factors B/A and B are known as the linear and parabolic growth factors respectively.

Figure 5:
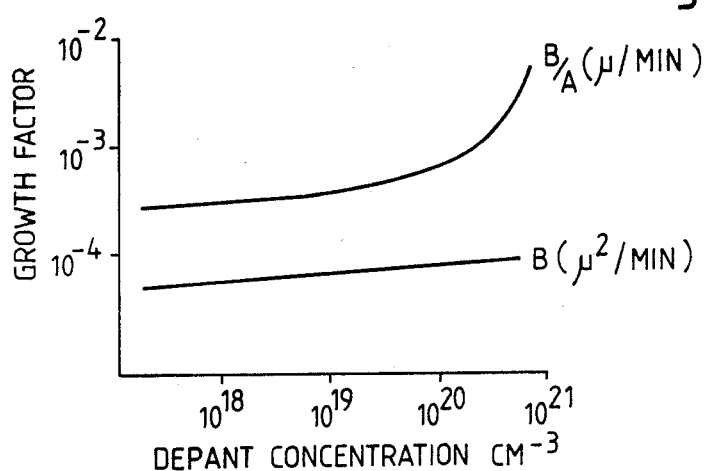
FIG. 5 illustrates the relationship between dopant concentration and oxidation rate.

The difference in oxidation rate between doped and undoped material is dependent on the dopant concentration. By using dopant concentrations above $5 \times 10^{19}$ $cm^{-3}$ a significant increase in the linear growth factor (B/A) is obtained, there being a much smaller increase in the parabolic growth factor B. Its effect is illustrated in FIG. 5 of the accompanying drawings. It can be seen for example that by using a dopant concentration of about $8 \times 10^{20}$ cm−3, a ten-fold increase in oxidation rate over that of undoped silicon is obtained.

The enhancement of oxidation rate is decreased by increasing the pressure at which oxidation is performed. However, increasing the pressure reduces the time needed for oxidation to form a trench thus confining the oxidation process mainly to the linear part of the characteristic where the most significant enhancement of oxidation rate is exhibited. In practice there is thus a trade-off between processing yield and the difference between the rate, of oxidation of doped and undoped material. Typically, we employ oxygen pressures up to 30 atmospheres and preferably from 10 to 20 atmospheres.

We have successfully formed oxide filled trenches 6 microns in depth by 1 micron width by oxidation of an 8 micron deep implantation of phosphorus ions. Oxidation was performed at a pressure of 10 atmospheres and a temperature of 900° C. for a time of 200 minutes. During this process oxidation to a full depth of the trench was achieved whilst 2 microns of the substrate surface was oxidized thus giving a finished trench depth of 6 microns. This demonstrates the feasibility of the process described above.

The method provides linear oxidation rates for oxide depths of at least 5 microns which is effective for VLSI trench requirements. Also the method has been found to provide the low midgap interface state densities and the stable boundary conditions necessary for the production of integrated circuits.

What is claimed is:

1. A method of fabricating an oxide-filled isolation trench in a major surface of a silicon semiconductor substrate, the trench having a width of about 1 micron and having a depth exceeding its width, the method consisting of the steps of applying a mask to said surface, said mask having an opening defining the position and width of the trench, implanting phosphorus or arsenic dopant ions into the substrate via said opening to a concentration of at least $5 \times 10^{20}$ $cm^{-3}$ and to a depth of about 8 microns, removing the mask, and subjecting the dopant substrate to an oxygen atmosphere at a temperature of 850° to 950° C. at a pressure of 10 to 20 atmospheres so as to convert preferentially the doped silicon to silicon oxide to depth of about 6 microns and a width of about 1 micron thereby forming the isolation trench, said preferential conversion of doped silicon to silicon oxide being confined substantially to a linear growth of oxide.

2. A method as claimed in claim 1, wherein said dopant ions are implanted at an energy of 50 to 150 KeV.

* * * * *